United States Patent
Podolski et al.

(10) Patent No.: US 12,320,853 B2
(45) Date of Patent: Jun. 3, 2025

(54) SYSTEMS AND METHODS FOR AUTOMATIC TIME DOMAIN REFLECTOMETER MEASUREMENT ON A UNI-DIRECTIONAL DRIVE CHANNEL

(71) Applicant: Advantest Corporation, Tokyo (JP)

(72) Inventors: Siegfried Podolski, Böblingen (DE); Bernhard Roth, Böblingen (DE)

(73) Assignee: Advantest Corporation, Tokyo (JP)

( * ) Notice: Subject to any disclaimer, the term of this patent is extended or adjusted under 35 U.S.C. 154(b) by 223 days.

(21) Appl. No.: 17/352,056

(22) Filed: Jun. 18, 2021

(65) Prior Publication Data

US 2021/0311118 A1 Oct. 7, 2021

Related U.S. Application Data

(63) Continuation of application No. PCT/EP2018/086419, filed on Dec. 20, 2018.

(51) Int. Cl.
*G01R 31/319* (2006.01)
*G01R 31/28* (2006.01)

(52) U.S. Cl.
CPC ..... *G01R 31/3191* (2013.01); *G01R 31/2834* (2013.01); *G01R 31/31917* (2013.01)

(58) Field of Classification Search
CPC .............................. G01R 31/00; G01R 31/3191
USPC .................................................. 324/532–535
See application file for complete search history.

(56) References Cited

U.S. PATENT DOCUMENTS

| | | | |
|---|---|---|---|
| 4,241,305 A | * | 12/1980 | Dickerson ............ G01R 31/083 324/532 |
| 4,630,228 A | | 12/1986 | Tarczy-Hornoch et al. |
| 5,376,888 A | * | 12/1994 | Hook ...................... G01N 22/04 324/533 |
| 6,609,077 B1 | | 8/2003 | Brown et al. |
| 2010/0176815 A1 | * | 7/2010 | Roth ................. G01R 31/31905 324/533 |
| 2012/0081129 A1 | | 4/2012 | Negishi |
| 2013/0182753 A1 | | 7/2013 | Delforce et al. |

FOREIGN PATENT DOCUMENTS

KR 20180075700 7/2018

* cited by examiner

*Primary Examiner* — Vincent Q Nguyen

(57) ABSTRACT

Embodiments of the present invention provide systems and methods for automatically performing TDR calibration to compensate for the time delay of a signal carried over a transmission environment (e.g., cable or other electrical path) used during DUT testing. A signal provider generates a signal along a signal path, and a circuit comprising a capacitor coupled to the signal provider and a diode coupled to the capacitor receives the signal periodically. A measurement unit coupled to the capacitor and the diode measures a voltage at the capacitor to determine a signal characteristic value of the signal along the signal path. The signal characteristic value is used to determine the electrical length (delay) of the transmission environment. TDR calibration is performed using the electrical length to compensate for the time delay/reflections over the transmission environment during testing.

22 Claims, 7 Drawing Sheets

SYSTEMS AND METHODS FOR AUTOMATIC TIME DOMAIN REFLECTOMETER MEASUREMENT ON A UNI-DIRECTIONAL DRIVE CHANNEL

CROSS-REFERENCE TO RELATED APPLICATION

This application is a continuation of International Patent Application No. PCT/EP2018/086419 filed on Dec. 20, 2018 with the European Patent Office, which is incorporated herein by reference in its entirety as if fully set forth herein.

FIELD

Embodiments of the present invention generally relate to the field of device testing. More specifically, embodiments of the present invention relate to methods and systems for performing time domain reflectometer measurements on automated test equipment.

BACKGROUND

A device or equipment under test (e.g., a DUT) is typically tested to determine the performance and consistency of the operation of the device before the device is sold. The device can be tested using a large variety of test cases, and the result of the test cases is compared to an expected output result. When the result of a test case does not match the expected output value, debugging is performed to identify and correct any defects that result from the device and/or to bin the device based on performance.

A DUT is usually tested by automatic or automated test equipment (ATE) that conducts complex testing using software and automation to improve efficiency. The DUT may be a memory device or other component intended to be integrated into a final product, such as a computer or other electronic device (e.g., a smartphone or appliance).

During a typical semiconductor manufacturing process, integrated circuits (ICs) are tested to ensure proper operation. The ATEs perform necessary tests to ensure functionality and quality. In general, a test to be performed on an IC consists of a set of digital pattern vectors that translate to stimulus voltage levels to be applied to input signal pins of the DUT according to a pre-specified timing. Signals captured from output signal pins of the DUT are translated into corresponding response vectors that may be analyzed to determine whether the DUT is operating according to specifications. The ATE generally provides a number of signal generating resources that may generate signals with configurable signal level and configurable timing. The tester also provides signal processing resources capable of converting signals generated by the DUT (e.g. analog signals) into a format readable by the tester (e.g., digital signals). The signal processing resources may also be configurable.

A typical automated tester for integrated circuits includes a set of test channels connected to separate pins of an IC or DUT. In an ATE System with digital drive/receive channels, it is important to calibrate the timing of every channel so that all channels generate/receive the signals at a predetermined time value, relative to the DUT. This type of calibration is often called skew calibration.

While the timing can be calibrated directly at the input/output of the pin-electronics, the pin electronics are typically located on a separate board within the automated tester. The DUT is typically connected to the pin-electronics using transmission lines, (e.g., cables or pc-board traces or a combination of both). The use of transmission lines can result in timing differences of unknown duration. Furthermore, some of the timing differences may be in the domain of the ATE user (and not in the domain of the ATE manufacturer). Therefore, it is often difficult to perform timing calibration based on a measurement of the total time difference for use during the final programming of each digital channel time domain reflectometer using time-domain reflectometry (TDR) calibration.

Most digital ATE channels with moderate signal speeds include a driver circuit and a receiver or comparator circuit that can be used to perform TDR calibration. FIG. 1A shows a conventional driver circuit with a conventional comparator circuit for performing TDR calibration. TDR measures the reflections that result from a signal travelling through a transmission environment (e.g., a circuit board trace, a cable, a connector). The TDR instrument sends a signal (e.g., a pulse) through the medium and compares reflections from the unknown transmission environment to those produced by a standard impedance. The sample point of the comparator is swept at two different thresholds in order to measure the time between transmitted and reflected signal as shown in FIG. 1B.

ATE channels operating at very high-signal speeds and consisting of only a dedicated driver or a dedicated receiver tend to be uni-directional due to the DUT's requirements at very high-speed signals. Combining both circuits on the board inside the ATE can have a significant negative effect on bandwidth, and adds additional cost for components which are not otherwise needed during normal operation.

SUMMARY

Accordingly, embodiments of the present invention provide systems and methods for automatically performing calibration based on TDR measurements for performing DUT testing using, for example, an ATE uni-drive channel. Advantageously, embodiments do not require a comparator circuit or a receiver circuit, and therefore can perform TDR calibration without significantly reducing the bandwidth of the testing equipment.

According to one embodiment, an apparatus for testing a device under test (DUT) is disclosed. The apparatus includes a signal provider operable to generate a signal along a signal path, said signal path including an electrical length (TD) and operable to be coupled to said DUT, a circuit including a capacitor coupled to the signal provider and to a diode coupled to the capacitor, a measurement unit coupled to the capacitor and the diode and operable to measure a voltage at the diode to determine a signal characteristic value of the signal along the signal path, means for determining said electrical length according to the signal characteristic value, and means for performing time-domain reflectometry (TDR) calibration according to the electrical length to test the DUT.

According to some embodiments, the signal provider is operable to generate the signal periodically according to at least one of a sine wave, pulses including a constant pulse width, and pulses including widths equal to half of a period.

According to some embodiments, the signal generator varies a period of the signal, and the period of the signal is significantly greater than 4xTD.

According to some embodiments, the signal generator varies a period of the signal, and the period of the signal is equal to at least one of: 3/4xTD; 4/5xTD; and 4/7xTD.

According to some embodiments, the voltage at the capacitor is pulled to a level below a voltage of the signal path to reverse bias the capacitor.

According to some embodiments, the voltage at the capacitor is pulled to a level above a voltage of the signal path to reverse bias the capacitor.

According to some embodiments, a characteristic impedance of the signal path is equal to a source impedance of the signal provider.

According to some embodiments, the voltage at the capacitor is reduced below a voltage of the generated signal to detect a peak voltage of the generated signal, and the peak voltage is the signal characteristic value of the signal along the signal path.

According to some embodiments, the voltage at the capacitor is increased above a voltage of the generated signal to detect a minimum voltage of the generated signal, and the minimum voltage is the signal characteristic value of the signal along the signal path.

According to some embodiments, the signal characteristic value includes at least one of a root mean square voltage, a measured power level, a measured average power, and a measured peak voltage.

According to some embodiments, the signal provider includes a uni-drive channel.

According to another embodiment, a method of testing a device under test (DUT) is disclosed. The method includes generating a signal along a signal path including an electrical length (TD), said signal path including reflections caused by the signal, varying a period of the signal, determining a signal characteristic value of the signal along the signal path during the period, determining the electrical length based on the signal characteristic, and performing time-domain reflectometry (TDR) calibration for testing the DUT using the electrical length.

According to some embodiments, the performing TDR calibration compensates for the reflections to test the DUT.

According to some embodiments, said generating the signal includes generating the signal periodically according to at least one of a sine wave pulses including a constant pulse width, and pulses including widths equal to half of a period.

According to some embodiments, a period of the signal is significantly greater than 4xTD.

According to some embodiments, a period of the signal is equal to at least one of 3/4xTD, 4/5xTD, and 4/7xTD.

According to some embodiments, the signal characteristic value includes at least one of a root mean square voltage, a measured power level, a measured average power, and a measured peak voltage.

According to a different embodiment, a system for testing a device under test (DUT). The system includes a processor, and a memory in communication with the processor for storing data and instructions, the processor executes instructions to perform a method of testing the DUT based on a signal characteristic value. The method includes generating a signal along a signal path including an electrical length (TD), said signal path including reflections caused by the signal, varying a period of the signal, determining a signal characteristic value of the signal along the signal path during the period, determining the electrical length based on the signal characteristic, and performing time-domain reflectometry (TDR) calibration for testing the DUT using the electrical length.

According to some embodiments, said performing time-domain reflectometry (TDR) calibration compensates for a delay of the electrical length to test the DUT.

According to some embodiments, said generating the signal includes generating the signal periodically according to at least one of a sine wave, pulses including a constant pulse width, and pulses including widths equal to half of a period.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1b shows a timing diagram of the conventional circuit according to FIG. 1a.

DETAILED DESCRIPTION

Figure 1A:
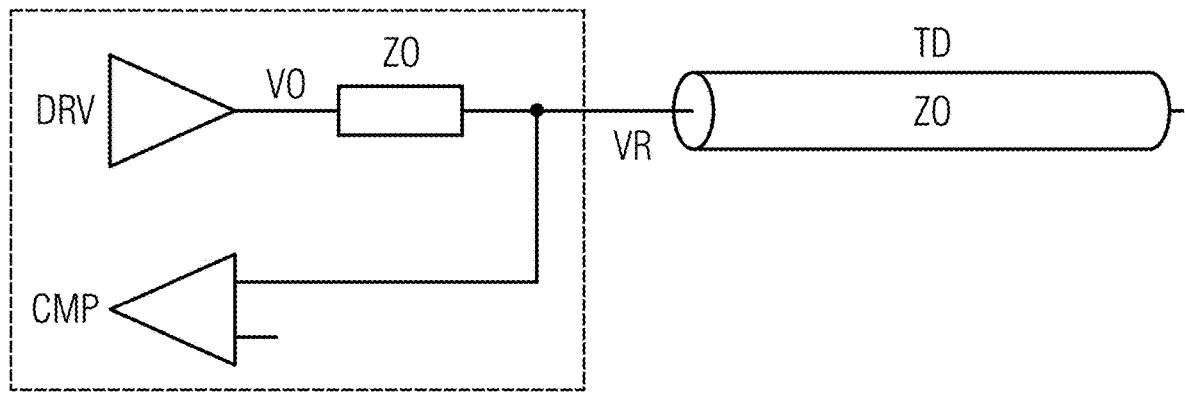
FIG. 1a shows a conventional schematic block diagram of a circuit for implementing a time domain reflection (TDR) calibration.
Figure 1B:
Figure 1B:
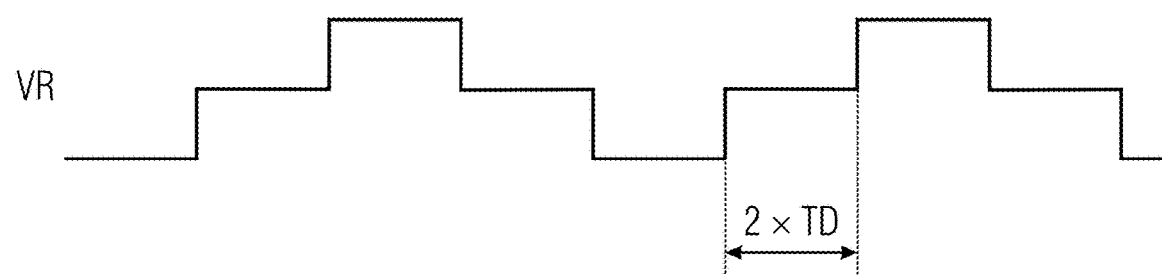

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 6) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 2:
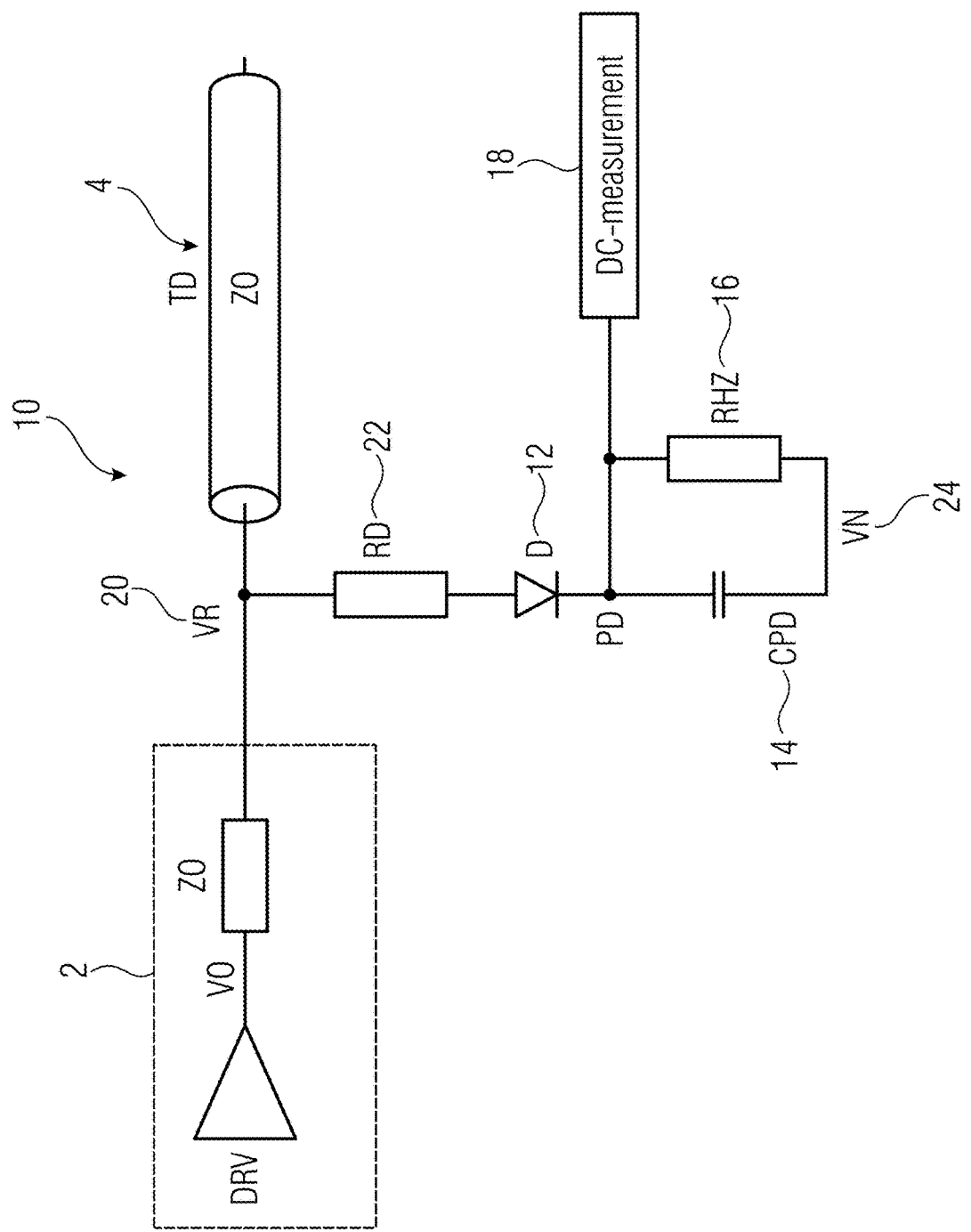
FIG. 2 shows a schematic block diagram of a circuit for a TDR calibration according to an embodiment of the present invention.

Automatic Time Domain Reflectometer
Measurement and Calibration of Uni-Directional
Drive Channel Embodiments of the present invention provide systems and methods for automatically performing DUT testing applications and may be employed using any type of ATE. FIG. 2 is a block diagram depicting an exemplary apparatus 10 for testing a device-under test (DUT) according to an embodiment of the present invention. The apparatus 10 may comprise a uni-drive channel 2 including a driver circuit ORV which includes a signal provider (not illustrated), a circuit arrangement including a diode D 12, a capacitor CPD 14, a discharge element, e.g., a resistor RHZ 16 and DC measurement unit 18, and a signal path 4. In the example of FIG. 2, the diode D 12 includes a small parasitic capacitance coupled to a terminal, e.g., an anode, at some point in the signal chain. The anode of the diode D 12 can be connected to a node VR 20 via optional low-parasitic damping resistor DR 22 where the transmission into the unknown electrical length TD (e.g., signal path 4) begins. For example, the anode of the diode D 12 can be connected at the output of the driver circuit ORV of the uni-drive channel 2. The other end of the signal path 4 is not terminated, e.g., is left as an open circuit. The characteristic impedance of the signal path 4 is ZO and the source impedance of the driver circuit ORV, e.g., the signal provider, has the same value as the characteristic impedance. Having the same value indicates that the value of the source impedance of the signal provider could have an equivalent value, e.g., +/−5% the value of the characteristic impedance of signal path 4. The value of the source impedance may have a different value from the value of the characteristic impedance.

A second terminal of the diode D 12, e.g., cathode of the diode D 12, is connected to one end of the capacitor CPD 14 for effectively creating a peak detector circuit. The other end of the capacitor CPD 14 is connected to a voltage node VN 24. The voltage node VN 24 may be a fixed voltage source. The resistor RHZ 16 may be a high-impedance resistor and the resistor RMZ 16 is connected in parallel to the capacitor CPD 14. The DC measurement unit 18 is configured to measure a voltage of at a terminal of the capacitor CPD 14. The node at the peak detector (the capacitor CPD 14) is monitored by the DC measurement unit 18. The DC measurement unit 18 may be a digital volt-meter DVM or an analog-to-digital-converter ADC. The measured voltage by the DC measurement unit 18 represents a peak level at the signal provider side of the signal path 4 and is the signal characteristic value.

In a normal mode operation, (e.g., not a calibration mode), the voltage value at the node VN 24 is pulled above the voltage at the signal path 4 so that the diode D 12 is reverse biased and does not disturb the normal high speed drive signal. In a calibrating mode operation, the voltage value at the node VN 24 is pulled to a value at least one diode drop, e.g., 0.7 V, below the level of the generated signal to detect the peak. When calibrating (e.g., during a test mode operation), the signal at the anode of the diode D 12 changes based on the applied period of the generated signal. Along with the signal change at the anode of the diode D 12, the signal at the cathode of the diode D 12 also changes in based on the applied period of the generated signal. The generated signal VO may be pulses with pulse width 50% of the period or sine wave or pulses with constant pulse width.

Figure 3A:
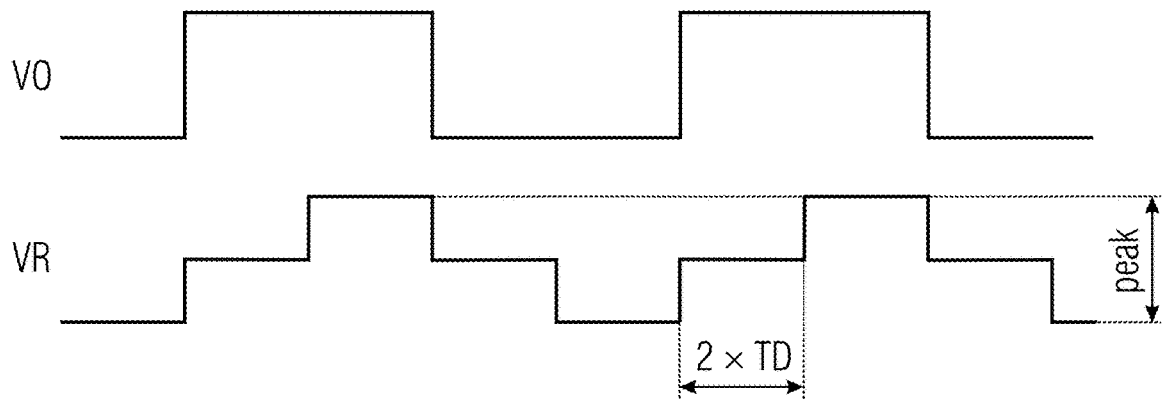
FIGS. 3a, 3b, and 3c show timing diagrams illustrating the time domain signals according to an embodiment of the present invention.
Figure 3B:
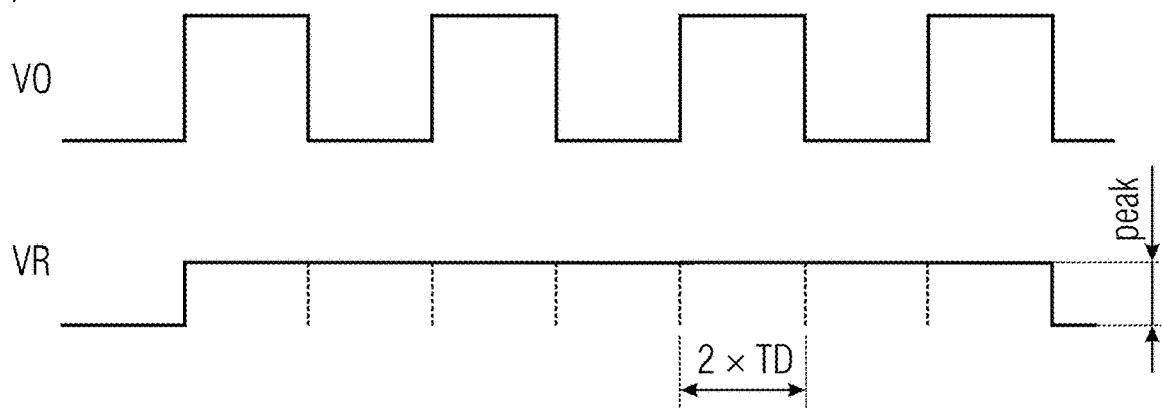
Figure 3C:
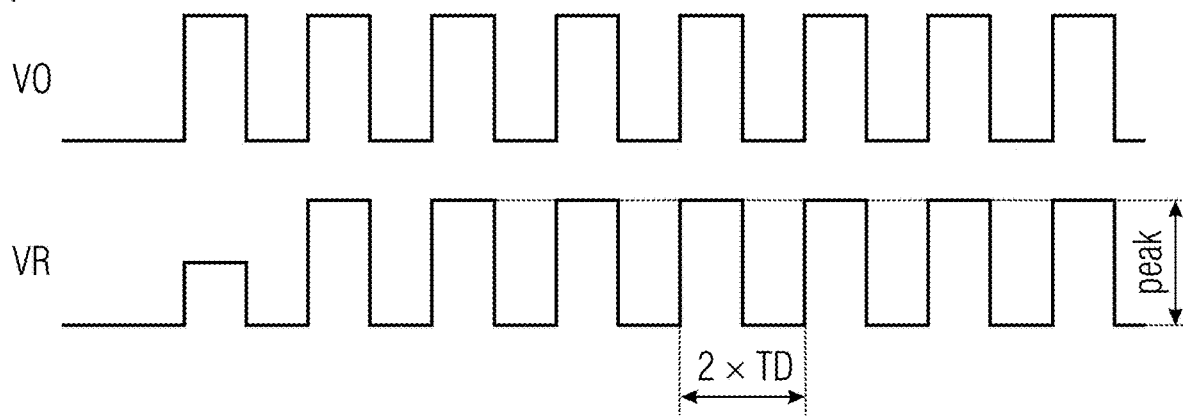

FIGS. 3A, 3B, and 3C show exemplary time domain signals of timing diagrams generated during DUT testing according to embodiments of the present invention. If the period of the generated signal is significantly larger than 4 times the electrical length TD (4xTD), then there is a typical TDR waveform at the line and the settled peak detector shown its maximum (shown as FIG. 3a). If the period of the generated signal is exactly 4xTD (3/4xTD or 4/5xTD or 4/7xTD or etc.), then the reflection occurs exactly at the provided pulse yielding a DC signal at the node VR 20 when assuming a lossless transmission line (shown as FIG. 3b). This results in a minimum voltage at the monitored peak detector. In case the far end of the signal path 4 is shorted, e.g., the signal path is terminated at short circuit, and then there are minima when the reflections cancel the transmitted pulses. This occurs at periods of the generated signal 2xTD (or 2/3xTD or etc.) as shown in FIG. 3c.

Figure 4:
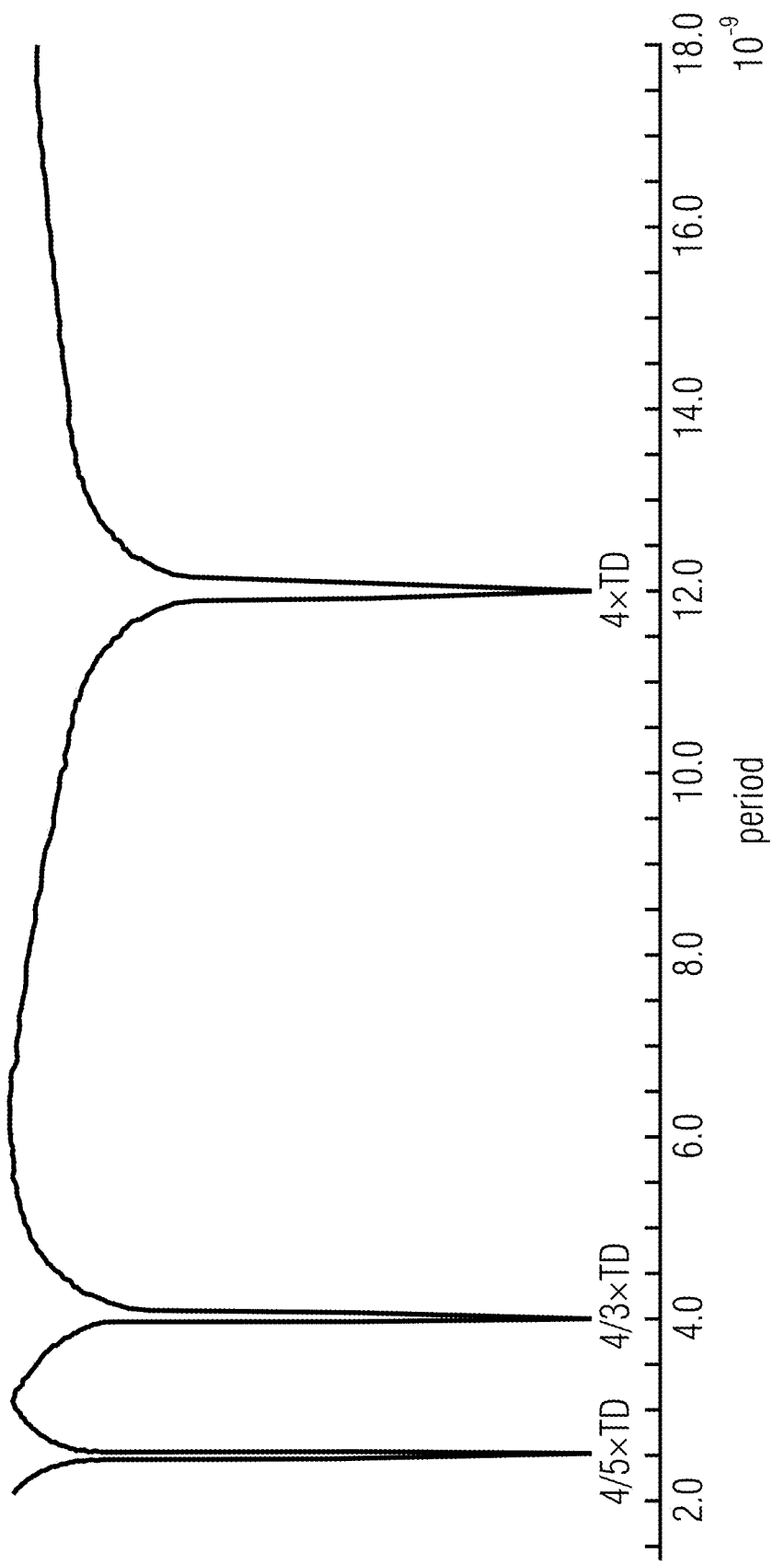
FIG. 4 shows a schematic diagram illustrating the detected result of the circuit according to an embodiment of the present invention.

FIG. 4 depicts a DC (peaked) value at node PD vs. the signal period with very sharp minima at the distinctive periods according to embodiments of the present invention. As shown in FIG. 4, the reflection occurs at the period 4/5xTD, 4/3xTD and 4xTD (corresponding to the exemplary time domain signals in FIG. 3b). As explained above, it is possible to implement the TDR-calibration with the uni-drive channel. e.g., without having a comparator circuit or a receiver circuit to avoid negative effect of bandwidth with minimum cost. Furthermore, by reducing the circuits on the printed board, the accuracy of the test result is also improved.

Figure 5A:
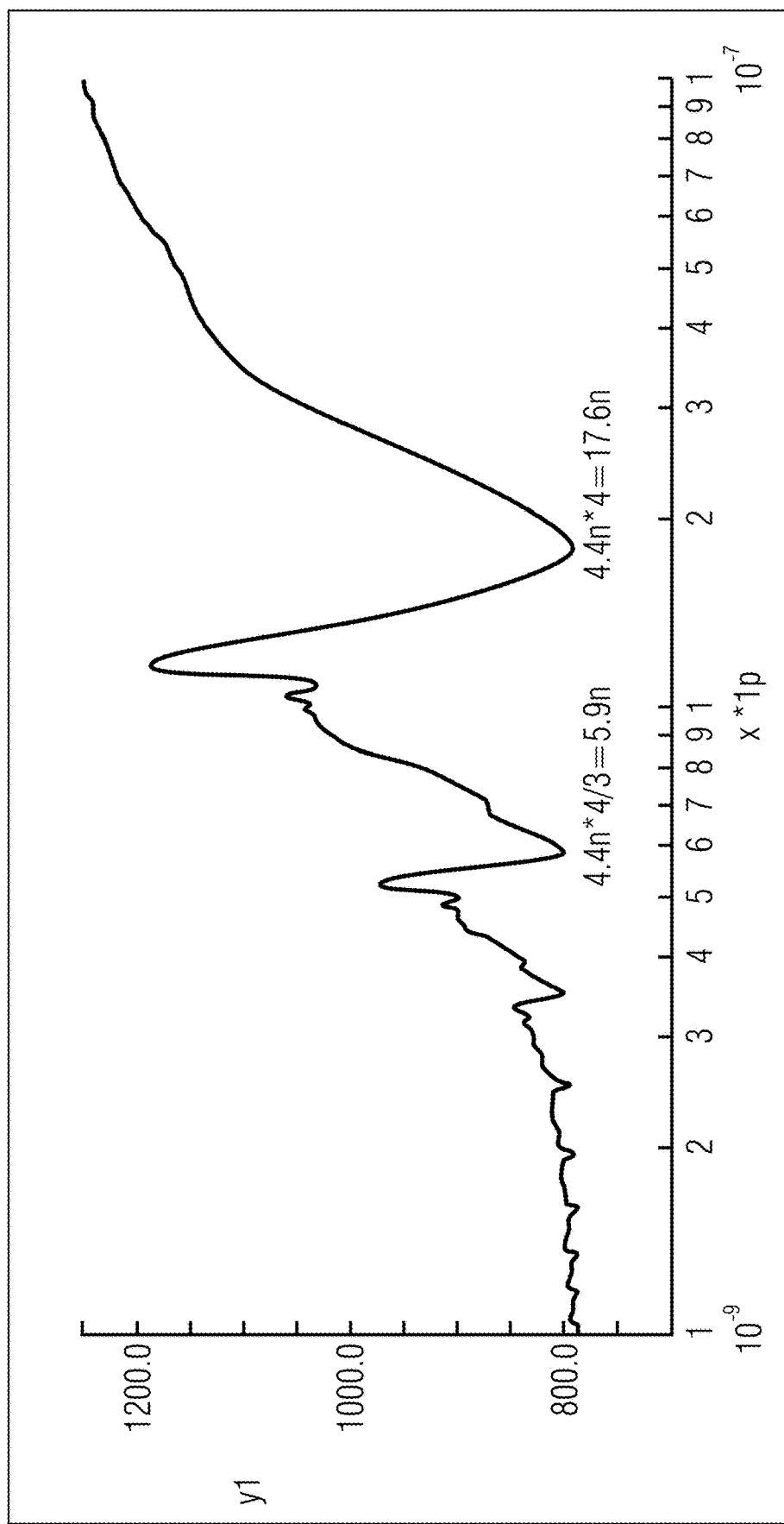
FIGS. 5a and 5b show a diagram illustrating a sample result of the circuit according to the present invention.
Figure 5B:
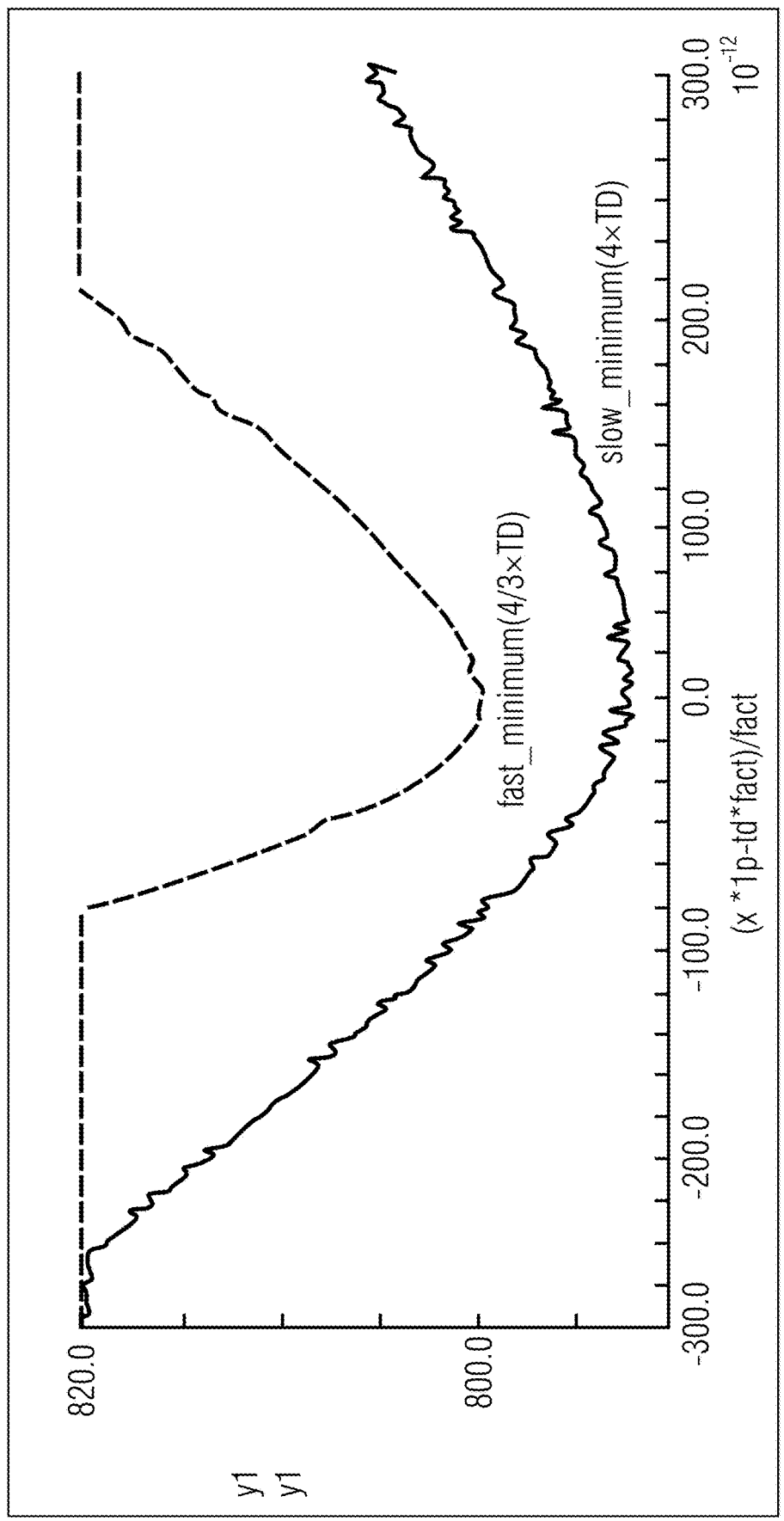

According to some embodiments, the diode D 12 connected in reverse order (e.g., the diode D 12 is coupled to the cathode to the signal provider side of the signal path 4 and with an anode to the capacitor CPD 14). In this case, the respective terms in the above explanation "below" and "above" for the node VN 24 and "minimum" and "maximum" at the peak detector are interchanged. FIGS. 5a and 5b show an exemplary result of a real measurement according to the present invention. The measurement environment is:

V0=1200 m Vpp
80 cm real coaxial cable, TD~ 4.4 ns
RD=0, CPD=10 nF, RHZ=100 k ohm FIGS. 5a and 5b show x-axis values normalized to the minima at 4xTD and 4/3xTD (offset) and TD itself (scale)

according to embodiments of the present invention. FIG. 5b is an enlargement of FIG. 5a. The non-ideal behavior comes from the fact that the cable has a frequency-dependent loss and therefore the reflected signal is not able to fully "fill" the gaps in the transmitted pulses. Therefore, it should be recognized that the accuracy of the test is improved.

Figure 6:
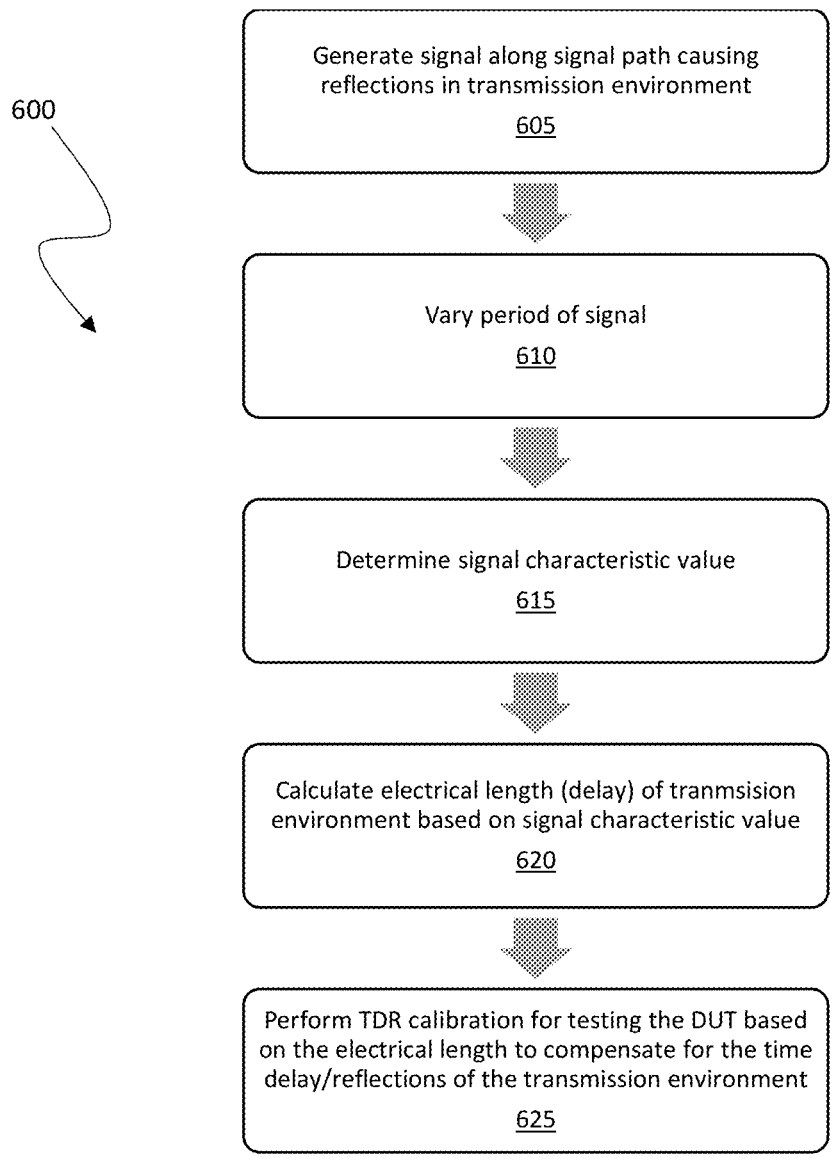
FIG. 6 is a flow chart depicting an exemplary sequence of computer implemented steps of a computer-controlled process for performing TDR calibration to test a DUT according to embodiments of the present invention.

With regard to FIG. 6, an exemplary sequence of computer implemented steps of a process 600 for automatically performing TDR calibration for testing a DUT using a transmission environment (e.g., a circuit board trace, a cable, a connector, etc.) having an electrical length (TD) is depicted according to embodiments of the present invention.

At step 605, a signal (e.g., a pulse or a sine wave) is generated along a signal path that generates reflections in the transmission environment according to the electrical length (TD). To perform TDR calibration, the reflections from the transmission environment can be compared to those produced by a standard impedance, for example, based on the time between transmitted and reflected signal.

At step 610, the period of the generated signal is varied. The signal can be generated in the form of a wave (e.g., sine wave) or a pulse (e.g., fixed width pulses, half-width pulses, etc.) The period can be varied according to the electrical length of the transmission environment (e.g., 2xTD, 4xTD, 3/4xTD, 4/5xTD, 4/7xTD, or 2/3xTD).

At step 615, a signal characteristic value of the signal transmitted within the transmission environment is determined during the period or periods varied in step 610.

At step 620, the value of the electrical length (e.g., the time of delay) is calculated according to the signal characteristic value.

At step 625. TDR calibration is performed for testing the DUT based on the electrical length to compensate for the delay/reflections caused by the transmission environment. Advantageously, process 600 can be performed without using a comparator circuit or a receiver circuit, and without significantly reducing the bandwidth of the testing equipment.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus. The inventive data stream can be stored on a digital storage medium or can be transmitted on a transmission environment such as a wireless transmission environment or a wired transmission environment such as the Internet.

Depending on certain implementation requirements, embodiments of the invention can be implemented in hardware or in software. The implementation can be performed using a digital storage medium, for example a floppy disk, a DVD, a Siu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable. Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier. In other words, an embodiment of the inventive method is a computer program having a program code for performing one of the methods described herein, when the computer program runs on a computer.

A further embodiment of the inventive methods is a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

According to a first aspect of the present invention, an apparatus for testing a device under test may comprises a signal provider configured to generate a signal and to apply the signal to a signal path which provides a reflection, and a circuit arrangement configured to determine a signal characteristic value of a result signal which is caused at a signal provider side of the signal path; wherein the apparatus is configured to vary a period of the generated signal, e.g., the signal is periodically generated, e.g., the period of the signal is swept; and wherein the apparatus is configured to obtain information about an electrical length of the signal path in dependence on signal characteristic values determined for different period of the generated signal. The generated signal may be one of sine wave, pulses with constant pulse width, and pulses with pulse width of half of the period. The signal characteristic value may be one of root mean square voltage, power, e.g., average power, and detected peak voltage over one or more period, e.g., positive and negative.

According to one exemplary embodiment of the present invention, an apparatus described. The apparatus is configured to determine the electrical length in dependence on a variation of the signal characteristic value over the period. The electrical length may be determined in dependence on a period for which the signal characteristic value fulfills a predetermined criterion, wherein the predetermined criteria is one of: local minimum, local maximum, global minimum, global maximum and predetermined shape of variation over period. The circuit arrangement may comprise a peak detector configured to determine a peak signal level at the signal provider side of the signal path as the signal characteristic value.

According to another embodiment of the present invention, the circuit arrangement may comprise a diode, wherein a first terminal of the diode is connected to the signal provider side, e.g., signal provider end, of the signal path, a capacitor connected between a second terminal of the diode and a voltage node, e.g., fixed voltage node, a discharge element configure to discharge the capacitor, e.g., connected in parallel to the capacitor; and DC measurement unit configured to measure a voltage at a terminal of the capacitor, for example, the measured voltage represents a peak level at the signal provider side of the signal path and is the signal characteristic value. The diode may be connected with an anode to the signal provider side of the signal path and with a cathode to the capacitor, or the diode may be connected with a cathode to the signal provider side of the signal path and with an anode to the capacitor. The circuit arrangement may comprise a resistor, wherein the diode is connected to the signal path via the resistor.

According to another embodiment of the present invention, one end of the signal path may be connected to the signal provider and the other end of the signal path may be terminated by an impedance having a different value to a characteristic impedance of the signal path, or terminated in an open circuit, i.e., having an open end, or terminated in a short circuit. The signal provider may have a source impedance which has an equivalent value, i.e., the difference is for example +/−5% to a characteristic impedance of the signal path or different value from the characteristic impedance.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Embodiments of the present invention are thus described. While the present invention has been described in particular embodiments, it should be appreciated that the present invention should not be construed as limited by such embodiments, but rather construed according to the following claims.

What is claimed is:

1. An apparatus for testing a device under test (DUT), the apparatus comprising:
   a signal provider operable to generate a signal along a signal path, said signal path comprising an electrical length (TD) and operable to be coupled to said DUT;
   a circuit comprising a capacitor coupled to the signal provider and to a diode coupled to the capacitor;
   a measurement unit coupled to the capacitor and the diode and operable to measure a voltage at the diode to determine a signal characteristic value of the signal along the signal path;
   means for determining said electrical length according to the signal characteristic value; and
   means for performing time-domain reflectometry (TDR) calibration according to the electrical length to test the DUT.

2. The apparatus as described in claim 1, wherein the signal provider is operable to generate the signal periodically according to at least one of: a sine wave; pulses comprising a constant pulse width; and pulses comprising widths equal to half of a period.

3. The apparatus as described in claim 1, wherein the signal provider varies a period of the signal, and wherein the period of the signal is significantly greater than 4xTD.

4. The apparatus as described in claim 1, wherein the signal provider varies a period of the signal, and wherein the period of the signal is equal to at least one of: 3/4xTD; 4/5xTD; and 4/7xTD.

5. The apparatus as described in claim 1, wherein the voltage at the capacitor is pulled to a level below a voltage of the signal path to reverse bias the capacitor.

6. The apparatus as described in claim 1, wherein the voltage at the capacitor is pulled to a level above a voltage of the signal path to reverse bias the capacitor.

7. The apparatus as described in claim 1, wherein a characteristic impedance of the signal path is equal to a source impedance of the signal provider.

8. The apparatus as described in claim 1, wherein the voltage at the capacitor is reduced below a voltage of the generated signal to detect a peak voltage of the generated signal, and wherein the peak voltage is the signal characteristic value of the signal along the signal path.

9. The apparatus as described in claim 1, wherein the voltage at the capacitor is increased above a voltage of the generated signal to detect a minimum voltage of the generated signal, and wherein the minimum voltage is the signal characteristic value of the signal along the signal path.

10. The apparatus as described in claim 1, wherein the signal characteristic value comprises at least one of: a root mean square voltage; a measured power level, a measured average power, and a measured peak voltage.

11. The apparatus as described in claim 1, wherein the signal provider comprises a uni-drive channel.

12. An apparatus for testing a device under test (DUT), the apparatus comprising:
   a signal provider operable to generate a signal along a signal path, said signal path comprising an electrical length (TD) and operable to be coupled to said DUT;
   a circuit comprising a capacitor coupled to the signal provider and to a diode coupled to the capacitor;

a measurement unit coupled to the capacitor and the diode and operable to measure a voltage at the diode to determine a signal characteristic value of the signal along the signal path;

a determining circuit determining said electrical length according to the signal characteristic value; and a calibration circuit performing time-domain reflectometry (TDR) calibration according to the electrical length to test the DUT.

13. The apparatus as described in claim 12, wherein the signal provider is operable to generate the signal periodically according to at least one of: a sine wave; pulses comprising a constant pulse width; and pulses comprising widths equal to half of a period.

14. The apparatus as described in claim 12, wherein the signal provider varies a period of the signal, and wherein the period of the signal is significantly greater than 4xTD.

15. The apparatus as described in claim 12, wherein the signal provider varies a period of the signal, and wherein the period of the signal is equal to at least one of: 3/4xTD; 4/5xTD; and 4/7xTD.

16. The apparatus as described in claim 12, wherein the voltage at the capacitor is pulled to a level below a voltage of the signal path to reverse bias the capacitor.

17. The apparatus as described in claim 12, wherein the voltage at the capacitor is pulled to a level above a voltage of the signal path to reverse bias the capacitor.

18. The apparatus as described in claim 12, wherein a characteristic impedance of the signal path is equal to a source impedance of the signal provider.

19. The apparatus as described in claim 12, wherein the voltage at the capacitor is reduced below a voltage of the generated signal to detect a peak voltage of the generated signal, and wherein the peak voltage is the signal characteristic value of the signal along the signal path.

20. The apparatus as described in claim 12, wherein the voltage at the capacitor is increased above a voltage of the generated signal to detect a minimum voltage of the generated signal, and wherein the minimum voltage is the signal characteristic value of the signal along the signal path.

21. The apparatus as described in claim 12, wherein the signal characteristic value comprises at least one of: a root mean square voltage; a measured power level, a measured average power, and a measured peak voltage.

22. The apparatus as described in claim 12, wherein the signal provider comprises a uni-drive channel.

* * * * *